(12) United States Patent
Rome

(10) Patent No.: US 8,414,731 B2
(45) Date of Patent: Apr. 9, 2013

(54) SYSTEM AND METHODS FOR ACCURATELY ALIGNING AND SPLICING CARRIER TAPE

(76) Inventor: Patrick Rome, El Paso, TX (US)

( * ) Notice: Subject to any disclaimer, the term of this patent is extended or adjusted under 35 U.S.C. 154(b) by 283 days.

(21) Appl. No.: 12/838,138

(22) Filed: Jul. 16, 2010

(65) Prior Publication Data

US 2012/0011717 A1 Jan. 19, 2012

(51) Int. Cl.
*B29C 65/00* (2006.01)
(52) U.S. Cl. .................. 156/304.5; 156/304.3
(58) Field of Classification Search ................ 156/304.5
See application file for complete search history.

(56) References Cited

U.S. PATENT DOCUMENTS 5,885,400 A * 3/1999 Davis et al. ................ 156/304.3
2002/0040761 A1* 4/2002 Sumida et al. ............. 156/304.3
* cited by examiner

*Primary Examiner* — Mark A Osele
*Assistant Examiner* — Nickolas Harm
(74) *Attorney, Agent, or Firm* — Luis M. Ortiz; Kermit D. Lopez; Tuesday A. Kaasch

(57) ABSTRACT

A method matching and splicing ends of carrier tape. A Uniquely patterned tab can be provided at an end/edge of carrier tape A and a uniquely patterned notch can be provided at an end/edge of carrier tape B. The uniquely patterned notch is complimentary to the uniquely patterned tab. The edge of carrier tape A is indexed (matched) to the edge of carrier tape B. The end/edge of carrier tape A and end/edge of carrier tape B can be secured together with adhesive tape that can be placed on at least one surface of carrier tape A and B. The uniquely patterned notch is complimentary to the uniquely patterned tab identify matching electronic components carried by carrier tape A and B. Indicia printed at the ends of carrier tape can also be used to identify component values in addition to use of unique tabs and notches formed at edge of tapes.

18 Claims, 4 Drawing Sheets

SYSTEM AND METHODS FOR ACCURATELY ALIGNING AND SPLICING CARRIER TAPE

BACKGROUND OF THE INVENTION

As miniaturization of components and circuit boards advance, smaller components will require precise carrier tape to carrier tape, reel to reel, interface in order to avoid costly problems or delays during product manufacturing. A missing, wrong or misplaced component occurring at a carrier tape reel changeover connection could result in loss of an entire run of finished circuit boards. An example of the problem caused by tape mismatch can occur during electronics manufacturing where an improper resistor value or integrated circuit package is spliced onto the end of an expended carrier tape. Improper components may not make it through a manufacturing run, but can result in component and circuit board damage and loss before the mismatch is discovered. Worse, if the mismatch is not discovered, an electronic system may ship with improperly installed electronic components, resulting in loss during end customer use of an assembled device.

The probability of such an occurrence at splicing may not be quantifiable or detectable. A significant product loss cost can be incurred following a carrier tape splicing error, which can then require very difficult rework, scrap of the circuit board assembly or, even more catastrophic, a product failure in the field. It is suspected that these costs are significant depending upon the board's use and its complexity.

Electronic components are carried by carrier tape, which in turn is carried by a reel. Other industrial and manufacturing processes also require the use of tape on a reel during operations, whether components are carried on the tape or not. What is needed is a means or methods for error proofing tape splicing.

SUMMARY OF THE INVENTION

The following summary is provided to facilitate an understanding of some of the innovative features unique to the embodiments and is not intended to be a full description. A full appreciation of the various aspects of the embodiments disclosed can be gained by taking the entire specification, claims, drawings, and abstract as a whole.

The present inventor believes that placing a matching pattern cut into the ends of tape for matching component reels can eliminate the probability of wrong components being used in the wrong point of use. Good procedures during assembly at points of use incorporating the present invention can reduce or eliminate errors commonly experienced in component/tape reel splicing.

It is therefore an object of the invention to enhance product reliability by reducing issues caused by misallocated placement of components that may shift pick location near a reeled tape splice interconnection.

It is another object of the invention to eliminate or reduce waste sections of empty leader tape and component reel carrier tape left at the end of the tape rolls and the disposal of such waste at the point of use.

It is yet another object of the invention to improve productivity at point of use by standardization to a reliable, consistent and easy to assemble tape interconnections that allows for continuous production.

It is also an object of the invention to reduce errors resulting from improper tape interconnections by assuring that only correct components are matched during carrier tape splicing by utilizing unique cut-out designs formed at the end of carrier tapes that identify component types via the tapes interconnection interface (i.e., tapes edges).

It is also an object of the invention to reduce labor required by end user operators for reel preparation and assembly of tape splice materials to the reel.

The present invention utilizes a combination of placing adhesive tape on the end of the carrier tape on reels and prepping the end of the reel tape with unique cuts to eliminate the problem of wrong components and misplaced components being merged into a manufacturing process during tape splicing. Adding a unique carrier tape end indexing pattern on the splicable ends of a reeled tape will be valuable in assuring a reduction of errors at electronic manufacturing facilities. A unique pattern end of the reeled carrier tape correlating with a particular component carried by a reel and carrier tape will absolutely resolve the misplacement issue that can be encountered during carrier tape splicing, especially with smaller components where it is difficult to distinguish between component types. Applying an indexing pattern for precise reeled carrier tape splicing during manufacturing and board assembly will result in substantial savings and reduced waste.

A method is claimed for matching and splicing ends of carrier tape. A uniquely patterned tab can be provided at an end/edge of carrier tape A and a uniquely patterned notch can be provided at an end/edge of carrier tape B. The uniquely patterned notch is complimentary to the uniquely patterned tab. The edge of carrier tape A is indexed (matched) to the edge of carrier tape B. The end/edge of carrier tape A and end/edge of carrier tape B can be secured together with adhesive tape that can be placed on at least one surface of carrier tape A and B. The uniquely patterned notch is complimentary to the uniquely patterned tab to identify matching electronic components carried by carrier tape A and B. Carrier tape A and B can be reeled.

The specific systems and methods herein are merely illustrative of the principles of this invention. Numerous modifications in form and detail may be made by those skilled in the art without departing from the true spirit and scope of the invention.

DETAILED DESCRIPTION OF THE INVENTION

In the following detailed description of the embodiments, reference is made to the accompanying drawings which form a part hereof, and in which is shown by way of illustration specific embodiments in which the invention may be practiced. These embodiments are described in sufficient detail to enable those skilled in the art to practice the invention, and it is to be understood that other embodiments may be utilized and that structural, logical and electrical changes may be made without departing from the spirit and scope of the present invention. The following detailed description is, therefore not to be taking in a limiting sense, and the scope of the present invention is defined only by the appended claims.

Figure 1:
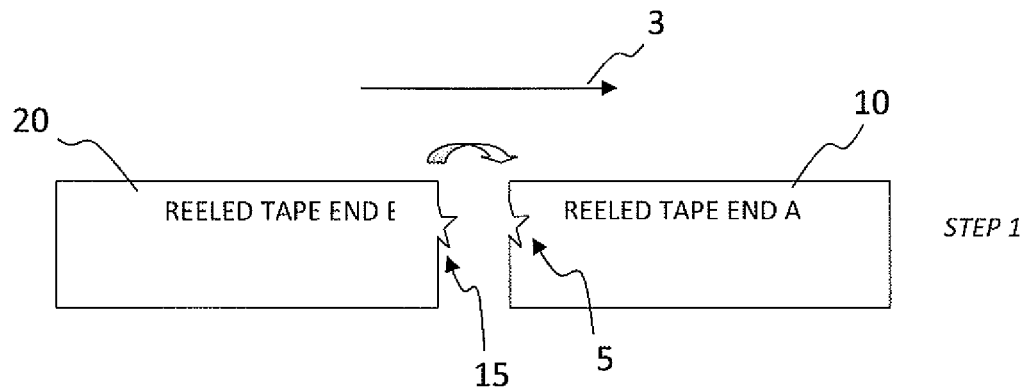
FIG. 1 illustrates carrier tape end A with a unique tab that matches a unique notch formed in carrier tape end B.
Figure 2:
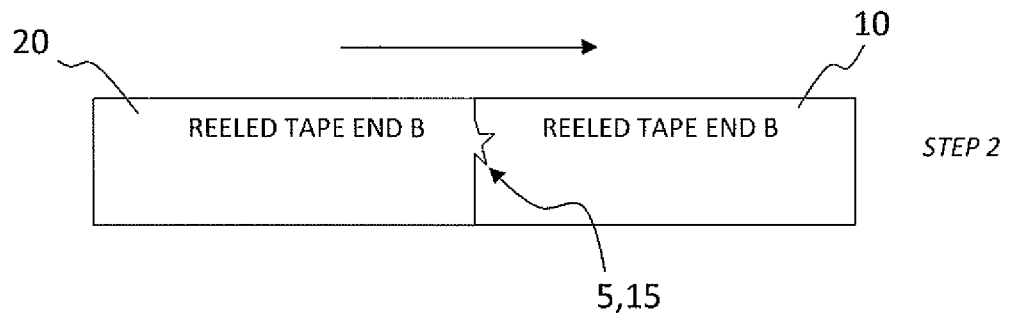
FIG. 2 illustrates carrier tape ends A and B connected together at their respective, matching tab and notch.

Referring to FIG. 1 and FIG. 2, carrier tape ends, whether containing components or not, can be spliced together more accurately using unique indexing patterns 5, 15 formed at (e.g., cut into) the edges of the carrier tape ends A and B. The carrier tapes can be reeled or not reeled. For purposes of this description, reeled tape ends are used for exemplary purposes. Also, arrow 3 depicts a flow direction for the carrier tape in a manufacturing process.

Figure 3:
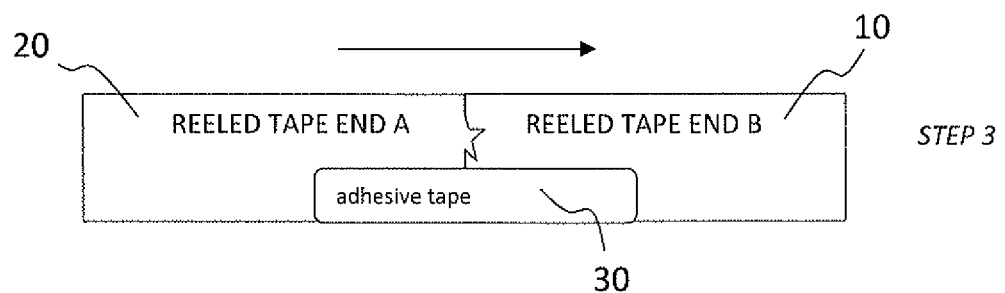
FIG. 3 illustrates the use of an adhesive tape placed over at least one surface of carrier tape ends A and B once they are matched by their unique and complimentary tab and notch.

As shown in FIG. 1, reel tape end A 10 has a unique tab 5 that matches a unique notch 15 formed on reeled tape end B 20. When connected together as shown in FIG. 2, reeled tape end A 10 can be accurately indexed and then spliced with reeled tape end B 20 by matching the ends of each tape. Then, referring to FIG. 3, adhesive tape 30 such as that available from Electroreel Components LLC of El Paso, Tex., can be used to splice indexed tape edges for reeled tape ends A and B together. It should be appreciated that a line methodology at manufacturing facilities can be developed to perform splicing and packaging.

In accordance with a methodology for preparing carrier tape reels for ease in splicing, a laser can be used to cut reeled carrier tape ends with precise indexing patterns. Reeled carrier tape ends with matching patterns unique for the type of components that are being carried can be assembled/indexed together at their edges and then secured/spliced together along at least one of their surfaces using adhesive tape, resulting in matching carrier tape (and associated components) being provided from carrier tape reel B.

Figure 4:
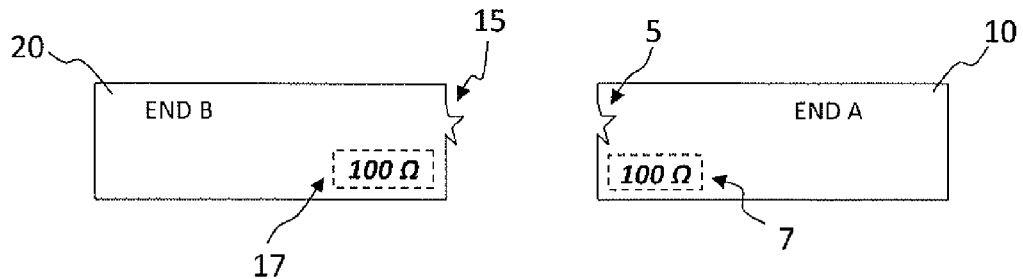
FIG. 4 illustrates component specific (e.g., resister) carrier tape end A with a unique tab that matches a unique notch formed in carrier tape end B and also with printed indicia identifying electronic component value (e.g., 100 ohm resistor)

Although the present invention provides the advantage of identifying matching carrier tape so that electronic components are matched during manufacturing processes, it can be useful to also provide indicia 7, 17 on the end of carrier tape 10, 20 that also properly identifies component values. Such a need is apparent where there is a limit to the number of patterns that can be used for identification by operators. FIG. 4 illustrates component specific carrier tape end A 10 with a unique tab 5 used for identifying resistors that matches a unique complimentary notch 15 formed in carrier tape end B 20 to also identify the carrier tape as bearing resistors. Carrier tapes A and B, however, also can have indicia 7, 17 printed onto its surface to identify electronic component value. For example only, FIG. 4 identifies the carrier tapes 10, 20 as bearing 100 ohm resistors.

Figure 5:
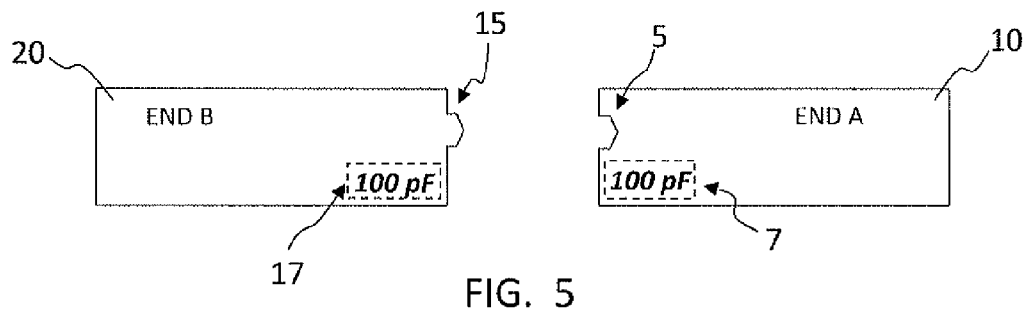
FIG. 5 illustrates component specific (e.g., capacitor) carrier tape end A with a unique tab that matches a unique notch formed in carrier tape end B and also with printed indicia identifying electronic component value (e.g., 100 pico farad capacitor)

FIG. 5 illustrates component specific carrier tape end A 10 with a unique tab 5 used for identifying resistors that matches a unique complimentary notch 15 formed in carrier tape end B 20 to also identify the carrier tape as bearing capacitors. Carrier tapes A and B, however, also can have indicia 7, 17 printed onto its surface to identify electronic component value. For example only, FIG. 4 identifies the carrier tapes 10, 20 as bearing 100 pico farad capacitors.

Figure 6:
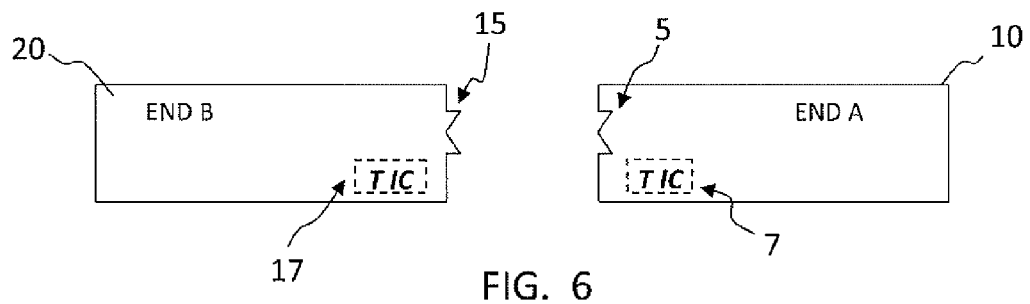
FIG. 6 illustrates component specific (e.g., integrated circuit) carrier tape end A with a unique tab that matches a unique notch formed in carrier tape end B and also with printed indicia identifying electronic component value (e.g., "T IC" integrated timer circuit)

FIG. 6 illustrates component specific carrier tape end A 10 with a unique tab 5 used for identifying resistors that matches a unique complimentary notch 15 formed in carrier tape end B 20 to also identify the carrier tape as bearing integrated circuits. Carrier tapes A and B, however, also can have indicia 7, 17 printed onto its surface to identify specific electronic component value. For example only, FIG. 4 identifies the carrier tapes 10, 20 as bearing a "T IC", or integrated timer circuit.

Figure 7:
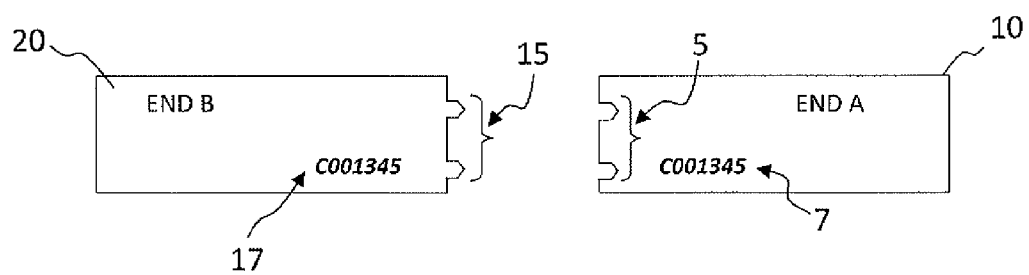
FIG. 7 illustrates component specific carrier tape end A with at least two unique tabs that matches at least two unique notches formed in carrier tape end B and also with printed indicia identifying electronic component value (e.g., component serial number)

FIG. 7 illustrates component specific carrier tape end A 10 with a unique tab 5 used for identifying resistors that matches a unique complimentary notch 15 formed in carrier tape end B 20 to also identify the carrier tape as bearing resistors. Carrier tapes A and B, however, also can have indicia 7, 17 printed onto its surface to identify electronic components in general. For example only, FIG. 4 identifies the carrier tapes 10, 20 as bearing component serial number C001345.

It should be appreciated that reel-based assembly equipment incorporating features of the present invention can be utilized on location at facilities. Manufacturing facilities can procure mechanical punches or laser cutters to cut unique indexing interfaces along the edges of reeled tape ends.

Figure 8:
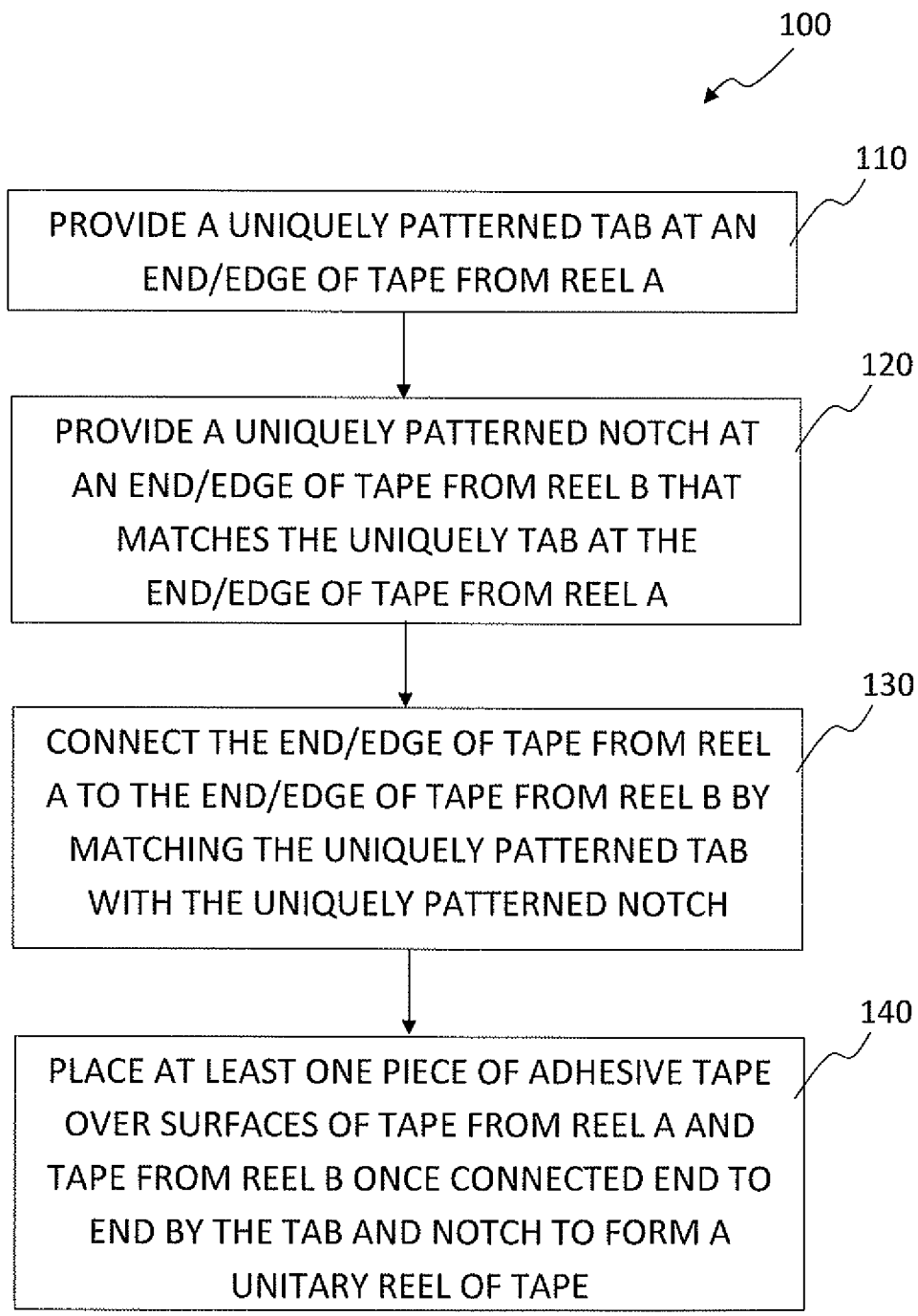
FIG. 8 illustrates a flow diagram of a methodology for properly indexing and matching carrier tape is shown.

Referring to FIG. 8, a flow diagram 100 of a methodology for using the invention that can also be implemented at the reeled carrier tapes point of use is illustrated. Referring to block 110, a uniquely patterned tab is provided at an end/edge of tape from reel A. Then as shown at block 120, a uniquely patterned notch is provided at an end/edge of tape from reel B that matches the unique tab at the end/edge of tape from reel A. At block 130, the end/edge of tape from reeled tape A is connected/indexed/matched to the end/edge of tape from reel B by matching the uniquely patterned tab with the uniquely patterned notch. Finally, as shown at block 140, at least one piece of adhesive tape is placed over surfaces of carrier tape from reel A and from reel B while the tapes are connected end to end by the tab and notch to form a unitary reel of tape.

Figure 9:
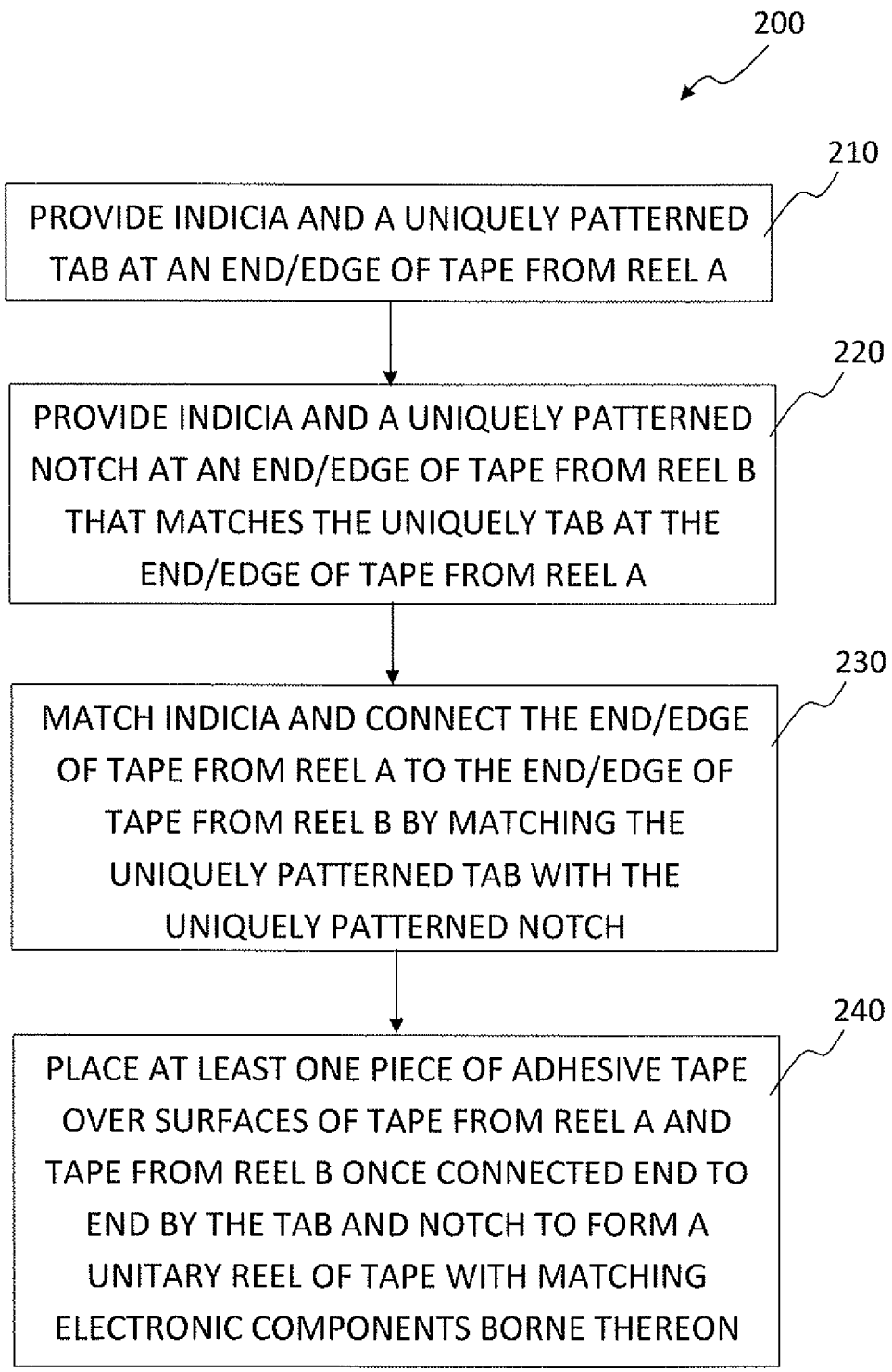
FIG. 9 illustrates a flow diagram of another methodology for properly indexing and matching carrier tape is shown.

Referring to FIG. 9, a flow diagram 200 of a methodology for using the invention that can also be implemented at the reeled carrier tapes point of use is illustrated. Referring to block 210, indicia and a uniquely patterned tab is provided at an end/edge of tape from reel A. Then as shown at block 220, indicia and a uniquely patterned notch is provided at an end/edge of tape from reel B that matches the unique tab at the end/edge of tape from reel A. At block 230, indicia is matched and then the end/edge of tape from reeled tape A is connected/indexed/matched to the end/edge of tape from reel B by matching the uniquely patterned tab with the uniquely patterned notch. Finally, as shown at block 240, at least one piece of adhesive tape is placed over surfaces of carrier tape from reel A and from reel B while the tapes are connected end to end by the tab and notch to form a unitary reel of tape that bears matching electronic components thereon.

The present invention can be used to aid assemblers in accurate and reliable interconnection of component reels. Reel assembly equipment can be provided at the point of use in the form of a fixture mounted on an assembly machine, cart or as part of a hand tool.

It is contemplated that the use of the present invention can involve components having different characteristics. It is intended that the scope of the present invention be defined by the claims appended hereto, giving full cognizance to equivalents in all respects.

It will be appreciated that various of the above-disclosed and other features and functions, or alternatives thereof, may be desirably combined into many other different systems or applications. Also that various presently unforeseen or unanticipated alternatives, modifications, variations or improvements therein may be subsequently made by those skilled in the art which are also intended to be encompassed by the following claims.

What is claimed is:

1. A method for matching and splicing ends of carrier tape, comprising:
    providing a tab at an end/edge of carrier tape A, said tab having a shape indicating the type of component carried on said carrier tape A;
    providing a notch at an end/edge of carrier tape B, wherein the notch has a shape that is complimentary to the tab;
    indexing the edge of carrier tape A to the edge of carrier tape B; and
    securing the end/edge of carrier tape A and end/edge of tape together with adhesive tape placed on at least one surface of carrier tape A and carrier tape B.

2. The method for matching and splicing ends of carrier tape of claim 1, wherein the at least one piece of adhesive tape is placed over surfaces of carrier tape A and B while the tapes are connected end to end by the tab and notch to form a unitary and continuing run of carrier tape bearing the same type of electronic components.

3. The method for matching and splicing ends of carrier tape of claim 1, wherein the same type of electronic components are carried by carrier tape A and B.

4. The method for matching and splicing ends of carrier tape of claim 3, wherein the tab and the notch identify the type of electronic components carried by carrier tape A and B.

5. The method for matching and splicing ends of carrier tape of claim 1, wherein the tab and the notch identify the type of electronic components carried by carrier tape A and B.

6. The method for matching and splicing ends of carrier tape of claim 1, further comprising providing printed indicia at each end of said carrier tape A and B, wherein said indicia indicates the type of electronic component being carried on the tape.

7. The method for matching and splicing ends of carrier tape of claim 6, wherein the at least one piece of adhesive tape is placed over surfaces of carrier tape A and B while the tapes are connected end to end by the tab and notch to form a unitary and continuing run of carrier tape bearing a single type of electronic component.

8. The method for matching and splicing ends of carrier tape of claim 6, wherein the same type of electronic components are carried by carrier tape A and B.

9. The method for matching and splicing ends of carrier tape of claim 8, wherein the tab and the notch identify the type of electronic components carried by carrier tape A and B.

10. The method for matching and splicing ends of carrier tape of claim 6, wherein the tab and the notch identify the type of electronic components carried by carrier tape A and B.

11. A method for matching and splicing ends of reeled carrier tape, comprising:
    providing printed indicia at an end/edge of reeled carrier tape A, wherein said indicia indicates a type of electronic component carried on said carrier tape A;
    providing a tab at said end/edge of carrier tape A, said tab having a shape indicating the type of component carried on said carrier tape A;
    providing the printed indicia and a notch at an end/edge of reeled carrier tape B, wherein the notch has a shape that is complimentary to the tab;
    indexing the edge of reeled carrier tape A to the edge of reeled carrier tape B; and
    securing the end/edge of reeled carrier tape A and end/edge of tape together with adhesive tape placed on at least one surface of reeled carrier tape A and reeled carrier tape B.

12. The method for matching and splicing ends of reeled carrier tape of claim 11, wherein the at least one piece of adhesive tape is placed over surfaces of carrier tape from reel A and from reel B while the tapes are connected end to end by the tab and notch to form a unitary reel of tape.

13. The method for matching and splicing ends of reeled carrier tape of claim 12, wherein the tab and the notch identify the type of electronic components carried by reeled carrier tape A and B.

14. The method for matching and splicing ends of reeled carrier tape of claim 11, wherein the same type of electronic components are carried by reeled carrier tape A and B.

15. The method for matching and splicing ends of reeled carrier tape of claim 14, wherein the tab and the notch identify the type of electronic components carried by reeled carrier tape A and B.

16. The method for matching and splicing ends of reeled carrier tape of claim 11, wherein the tab and the notch identify the type of electronic components carried by reeled carrier tape A and B.

17. A method for matching and splicing ends of reeled carrier tape bearing the same type of electronic components, comprising:
    providing a tab at an end/edge of reeled carrier tape A, said tab having a shape indicating the type of component carried on said carrier tape A;
    providing a notch at an end/edge of reeled carrier tape B, wherein the notch has a shape that is complimentary to the tab;
    indexing the edge of reeled carrier tape A to the edge of reeled carrier tape B; and
    securing the end/edge of reeled carrier tape A and end/edge of tape together with adhesive tape placed on at least one surface of reeled carrier tape A and reeled carrier tape B.

18. The method for matching and splicing ends of reeled carrier tape of claim 17, wherein at least one piece of adhesive tape is placed over surfaces of carrier tape from reel A and from reel B while the tapes are connected end to end by the tab and notch to form a unitary reel of tape.

* * * * *